United States Patent
Tsakalakos et al.

(10) Patent No.: US 8,258,047 B2
(45) Date of Patent: Sep. 4, 2012

(54) NANOSTRUCTURES, METHODS OF DEPOSITING NANOSTRUCTURES AND DEVICES INCORPORATING THE SAME

(75) Inventors: Loucas Tsakalakos, Niskayuna, NY (US); Joleyn Eileen Balch, Schaghticoke, NY (US)

(73) Assignee: General Electric Company, Niskayuna, NY (US)

( * ) Notice: Subject to any disclaimer, the term of this patent is extended or adjusted under 35 U.S.C. 154(b) by 1141 days.

(21) Appl. No.: 11/633,205

(22) Filed: Dec. 4, 2006

(65) Prior Publication Data
US 2010/0261338 A1    Oct. 14, 2010

(51) Int. Cl.
*H01L 21/20* (2006.01)
*H01L 21/36* (2006.01)

(52) U.S. Cl. .......... 438/478; 977/892
(58) Field of Classification Search .......... 977/892; 438/478

See application file for complete search history.

(56) References Cited

U.S. PATENT DOCUMENTS

| | | | |
|---|---|---|---|
| 5,280,183 A * | 1/1994 | Batzel et al. | 257/40 |
| 5,688,562 A * | 11/1997 | Hsiung | 427/434.3 |
| 6,036,778 A * | 3/2000 | Albrecht et al. | 118/402 |
| 6,536,106 B1 | 3/2003 | Jackson et al. | |
| 7,064,372 B2 | 6/2006 | Duan et al. | |
| 7,135,728 B2 | 11/2006 | Duan et al. | |
| 2002/0130311 A1 | 9/2002 | Lieber et al. | |
| 2003/0089899 A1 | 5/2003 | Lieber et al. | |
| 2003/0186522 A1 * | 10/2003 | Duan et al. | 438/584 |
| 2004/0137220 A1 * | 7/2004 | Tsuchiya et al. | 428/328 |
| 2005/0066883 A1 * | 3/2005 | Dubrow et al. | 117/68 |
| 2005/0110064 A1 | 5/2005 | Duan et al. | |
| 2005/0164432 A1 | 7/2005 | Lieber et al. | |
| 2005/0181587 A1 | 8/2005 | Duan et al. | |
| 2005/0279274 A1 | 12/2005 | Niu et al. | |
| 2006/0008942 A1 * | 1/2006 | Romano et al. | 438/99 |
| 2006/0105513 A1 | 5/2006 | Afzali-Ardakani et al. | |
| 2006/0148166 A1 | 7/2006 | Craig et al. | |
| 2006/0151820 A1 | 7/2006 | Duan et al. | |
| 2006/0211183 A1 | 9/2006 | Duan et al. | |
| 2007/0026645 A1 * | 2/2007 | Lieber et al. | 438/478 |
| 2007/0155025 A1 * | 7/2007 | Zhang et al. | 438/3 |
| 2008/0083950 A1 * | 4/2008 | Pan et al. | 257/347 |

OTHER PUBLICATIONS

A. Schomohl, et al.; "Functionalization of Oxidized Silicon Surfaces with Methyl Groups and Their Characterization"; Elsevier Superlattics and Microstructures; Institute of Physical Chemistry, University of Heidelber, 36 (2004), pp. 113-121.

(Continued)

*Primary Examiner* — Thao Le
*Assistant Examiner* — Tanika Warrior
(74) *Attorney, Agent, or Firm* — Ann M. Agosti

(57) ABSTRACT

A method for depositing nanowires is disclosed. The method includes depositing multiple nanowires onto a surface of a liquid. The method also includes partially compressing the nanowires. The method also includes dipping a substrate into the liquid. The method further includes pulling the substrate out of the liquid at a controlled speed. The method also includes transferring the nanowires onto the substrate parallel to a direction of the pulling.

9 Claims, 7 Drawing Sheets

OTHER PUBLICATIONS

Erdem Alaca, et al.; "Fabrication of Directed Nano Wire Networks Through Self-Assembly"; Department of Mechanical & Industrial Engineering; University of Illinois at Urbana—Champaign; 2004 IEEE; pp. 415-417.

Whang, Dongmok, et al.; "Large-Scale Hierarchical Organization of Nanowire Arrays for Integrated Nanosystems"; Department of Chemistry & Chemical Biology, Cambridge, Massachusetts 02138; Nano Letters, 2003, vol. 3, No. 9; pp. 1255-1259; 2003 American Chemical Society.

Huang, Yu, et al.; "Directed Assembly of One-Dimensional Nanostructures into Functional Networks"; Jan. 26, 2001; vol. 291; pp. 630-633; Science (www.sciencemag.org).

Tao, Andrea, et al.; "Langmuir-Blodgett Silver nanowire Monolayers for Molecular Sensing Using Surface-Enhanced Raman Spectroscopy"; Department of Chemistry, University of California, Berkeley, California; Nano Letters, 2003, vol. 3, No. 9; pp. 1229-1233; 2003 American Chemical Society.

* cited by examiner

NANOSTRUCTURES, METHODS OF DEPOSITING NANOSTRUCTURES AND DEVICES INCORPORATING THE SAME

BACKGROUND

The invention relates generally to nanowires, and, more particularly, to techniques for depositing nanowires and techniques for assembling electronic devices incorporating nanowires.

Nanostructures, and in particular, nanowires are known to have the potential to facilitate a new generation of electronic devices. Significant progress has been made in the area of nanowire synthesis and device application over past several years. Assembly of the nanowires is a critical factor in forming a functional electronic system. In order to effectively employ nanowires in most of the areas of nanotechnology, a controlled and predictable assembly of aligned nanostructures is desirable.

Various assembly techniques have been employed for alignment of the nanowires. Some of the commonly used techniques include direct growth methods for synthesis of nanowires in specific locations and post growth assembly techniques such as microfluidic assembly, electric field assembly, chemical patterning and Langmuir-Blodgett assembly. One specific technique is to apply Langmuir-Blodgett (LB) alignment techniques to align nanowires. The LB technique allows transfer of nanowire monolayers that are fully compressed, from a surface of water to a solid substrate by slowly passing a substrate through an air-water interface. The LB technique may also be used to assemble large area nanowire monolayers.

However, the existing assembly techniques have not been useful in yielding a controlled in-plane alignment and patterning of the nanowires that would make a significant impact in a wide variety of applications such as nanoscale electronics, optoelectronics and molecular sensing. Further, a major impediment to the emergence of a new generation of electronic devices based on nanostructures has been the inability to effectively grow and harvest nanowires that have consistent performance characteristics. Current techniques have not yielded desirable performance characteristics.

Accordingly, an improved assembly technique is needed to address one or more of the foregoing issues.

BRIEF DESCRIPTION

In accordance with one aspect of the invention, a method for depositing nanowires is provided. The method includes depositing a plurality of nanowires onto a surface of a liquid. The method also includes partially compressing the plurality of nanowires. The method also includes dipping a substrate into the liquid. The method further includes pulling the substrate out of the liquid at a controlled speed. The method also includes transferring the plurality of nanowires onto the substrate parallel to a direction of the pulling.

In accordance with another aspect of the invention, an electronic device is provided. The electronic device includes multiple nanowires disposed on a substrate and aligned in a single direction on the substrate within a range of about +/−20 degrees and having a density ranging between about 5 percent and about 90 percent of an area of deposition of the plurality of nanowires on the substrate.

In accordance with another aspect of the invention, a method of fabricating a nano field effect transistor is provided. The method includes depositing multiple nanowires onto a surface of a liquid. The method also includes partially compressing the nanowires. The method also includes dipping a substrate into the liquid. The method further includes pulling the substrate out of the liquid at a controlled speed. The method also includes transferring the nanowires onto the substrate parallel to a direction of the pulling. The method also includes forming a source electrode on the nanowires. The method further includes forming a drain electrode on the nanowires. The method further includes forming a gate electrode.

In accordance with another aspect of the invention, a system for depositing nanowires is provided. The system includes a trough configured to contain a liquid. The system also includes multiple rollers configured to move a flexible substrate through the trough containing the liquid. The system further includes a nanowire dispensing unit configured to deposit a plurality of nanowires onto a surface of the liquid. The system also includes a barrier configured to compress the plurality of nanowires.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As described in detail below, embodiments of the present invention include nanostructures, methods of depositing nanostructures and devices incorporating the same. As used herein, the term "nanostructures" refers to a structure having a region or at least one characteristic dimension with a dimension of less than about 500 nm. Some non-limiting examples of the nanostructures include nanowires, nanotubes, nanorods and quantum dots. In terms of material properties, nanostructures may be homogeneous or heterogeneous. In an example, the nanostructure may be at least one of substantially crystalline, monocrystalline, polycrystalline, amorphous, or a combination thereof. In another example, the nanostructures may contain heterojunctions of different compositions or homojunctions of a same composition. The method of depositing nanostructures is a modification of the Langmuir-Blodgett (LB) technique and may also be referred to, herein, as a "modified LB technique". The method disclosed herein may be used to manufacture any semiconductor device type and electronic component types. Further, the method may also be used in applications such as, but not limited to, electrical systems, optical systems and consumer electronics.

Figure 1:
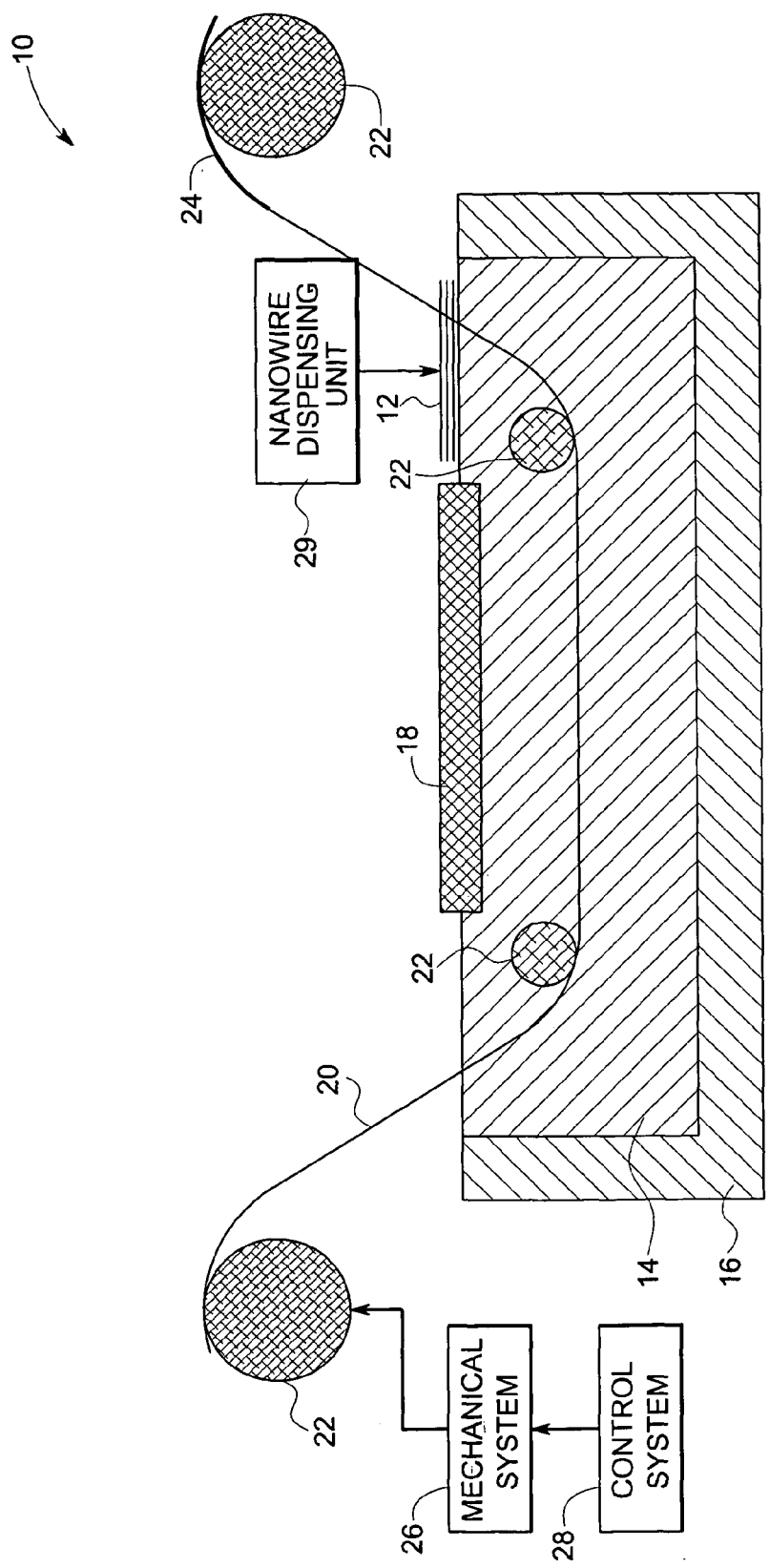
FIG. 1 is a schematic representation of a nanowire deposition system in accordance with embodiments of the present invention.

Turning now to the drawings, FIG. 1 is a schematic representation of a nanowire deposition system 10. The process will be described in more detail below with reference to FIGS. 7 and 8. The system 10 includes multiple nanowires 12 deposited onto a surface of a liquid 14. In an example, the liquid 14 may be deionized water. The liquid 14 may be contained in a trough 16. The trough 16 may also be referred to as an "LB trough". A trough barrier 18 may be disposed on the surface of the liquid 14 to partially compress the nanowires 12. An example of the trough barrier 18 may include teflon. In a particular embodiment, the nanowires 12 may be partially compressed by depositing multiple spacer molecules between the nanowires 12. The spacer molecules may also minimize agglomeration between the nanowires 12. Some non-limiting examples of the spacer molecules may include 1-octadecylamine and self assembled monolayers. In another embodiment, there may be no spacer molecules between the nanowires on the water surface. A substrate 20 may be dipped into the liquid 14 via multiple guide rollers 22. In a particular embodiment, the substrate 20 may be a flexible substrate. In another embodiment, the substrate 20 may be a rigid substrate, which may be dipped into the liquid 14 without the use of rollers 22. Some non-limiting examples of the substrate 20 may include a glass, a polymer, a metal, and a semiconductor. The substrate 20 may be pulled out of the liquid 14 at an opposite end of the trough 16 via rollers 22. The nanowires 12 are deposited onto a surface of the substrate 20 as the substrate 20 is pulled out of the liquid 14, parallel to a direction of pulling via surface tension of the liquid 14. Deposited nanowires 24 are aligned in-plane of the substrate 20. The rollers 22 may be motored by a mechanical system 26. Further, a control system 28 may automate the mechanical system 26. In a particular embodiment, a nanowire dispensing unit 29 may be used to automatically disperse nanowires from a growth substrate into a solution and then dispense the nanowires 12 onto a surface of the liquid 14.

Figure 2:
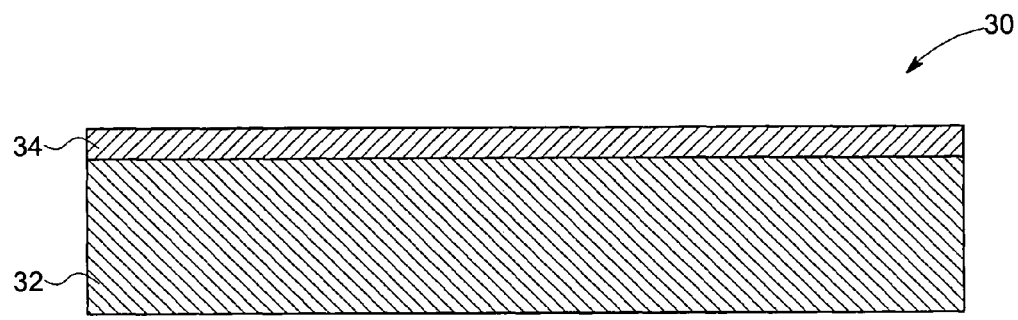
FIG. 2 is a cross-sectional view of a substrate coated with a dielectric layer.

FIG. 2 is a cross-sectional view of a system 30 including a substrate 32 that may be used in a nanoelectronic device array and depicts a first step in a process flow of metal deposition on nanowires that may be used in manufacturing the nanodevice array. A dielectric layer 34 is deposited onto the substrate 32. In a particular embodiment, the dielectric layer 34 may be deposited by chemical vapor deposition. In another embodiment, the dielectric layer 34 may be grown thermally. In an example, the dielectric layer 34 may include silicon oxide, silicon nitride, aluminum oxide, zirconium oxide, and hafnium oxide. Some non-limiting examples of the substrate 32 may include silicon, glass, a metal, a polymer or a combination thereof.

Figure 3:
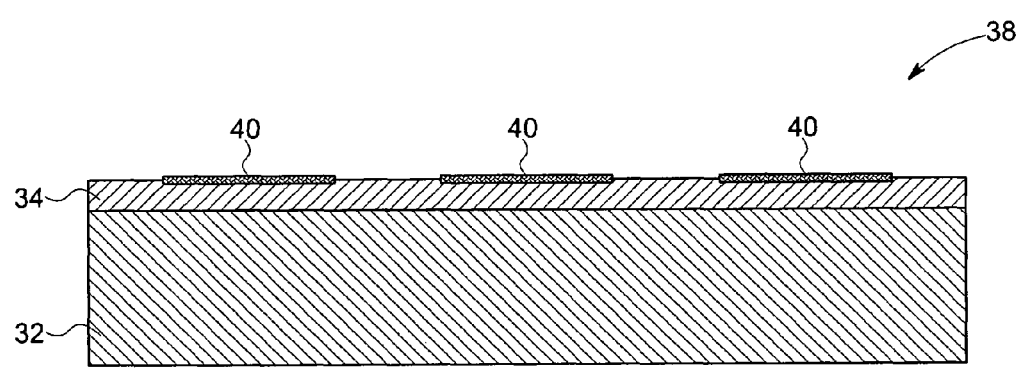
FIG. 3 is a cross-sectional view of nanowires deposited on the dielectric layer in FIG. 2 in accordance with embodiments of the present invention.

FIG. 3 is a cross-sectional view of a system 38 including nanowires 40 and illustrating a second step in the process flow of metal deposition. Multiple nanowires 40 may be deposited onto the dielectric layer 34. In a particular embodiment, the nanowires 40 may be deposited via the modified LB technique described above with reference to FIG. 1. In another embodiment, nanorods may be deposited onto the dielectric layer 34. Some non-limiting examples of semiconductor types of materials for nanowires may include Si, Ge, Si—Ge, Sn-oxide, In-oxide, Se, Bi—Te, B, C, GaN, InGaN, AlGaN, ZnO, CdSe, CdTe, GaAs, AlAs, InSb, SiC, $Mo_2C$, and a combination thereof.

Figure 4:
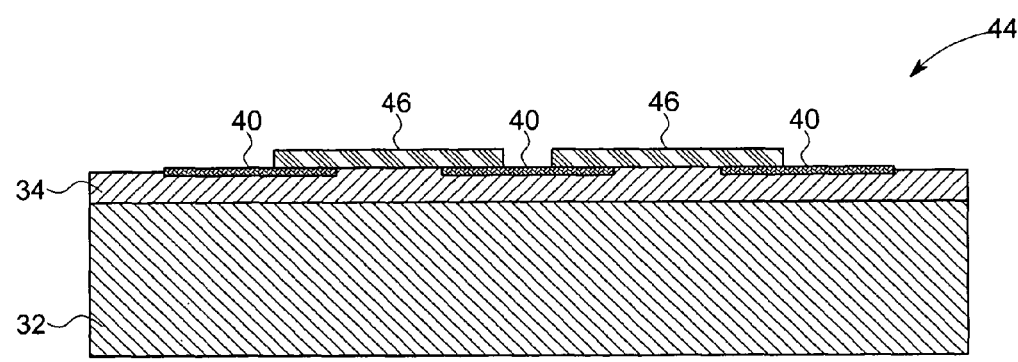
FIG. 4 is a cross sectional view of a metal deposited on the nanowire deposited substrate in FIG. 3.

FIG. 4 is a cross-sectional view of a system 44 illustrating a third step in the process flow of metal deposition. Once the nanowires 40 are deposited as shown in FIG. 3, a metal 46 may be deposited onto the nanowires 40, and subsequently patterned, as illustrated. In a particular embodiment, the metal 46 may be deposited and patterned onto the nanowires 40 by photolithography. Some non-limiting examples of the metal may include titanium, nickel, gold, aluminum, and palladium, and combinations thereof.

Figure 5:
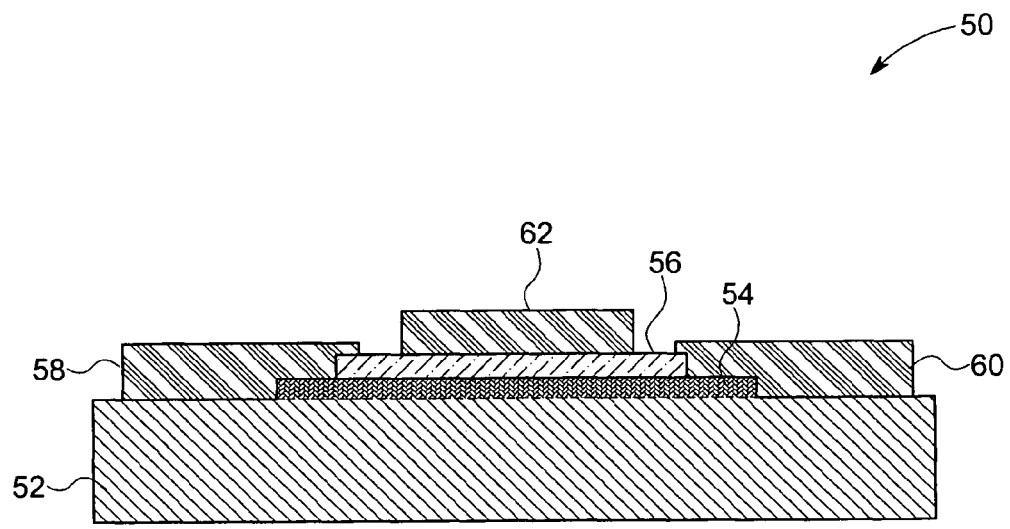
FIG. 5 is a cross-sectional view of a nanowire field effect transistor in accordance with embodiments of the present invention.

In another illustrated embodiment of the invention as shown in FIG. 5, a cross-sectional view of a field effect transistor (FET) 50 is depicted. As will be appreciated, the FET 50 may be employed in an electronic device. As used herein, an electronic device incorporating devices, such as the FET 50, having nanostructures, such as nanowires, may also be referred to as a nanoelectronic device. The FET 50 is manufactured using the modified LB technique of deposition of nanowires as discussed above. The FET 50 may include a substrate 52. Some non-limiting examples of the substrate 52 may include glass and polymer. Multiple nanowires 54 may be deposited onto the substrate 52 via the modified LB technique discussed with reference to FIG. 1. A gate dielectric 56 may be deposited onto the nanowires 54. Some non-limiting examples of the gate dielectric 56 may include silicon oxide, silicon nitride, aluminum oxide, zirconium oxide and hafnium oxide. A photoresist (not shown) may be deposited and patterned on the gate dielectric 56 in order to facilitate deposition and patterning of a source electrode 58 and a drain electrode 60. In a particular embodiment, the photoresist is patterned via photolithography. The gate dielectric 56 may further be etched to the nanowires 54 and the source electrode 58 and the drain electrode 60 may be formed onto the nanowires 54. Some non-limiting examples of the source electrode 58 and the drain electrode 60 may include titanium, gold, nickel and palladium. Similarly, photoresist may be employed in order to facilitate deposition and patterning of a gate electrode 62 on top of the gate dielectric 56.

Figure 6:
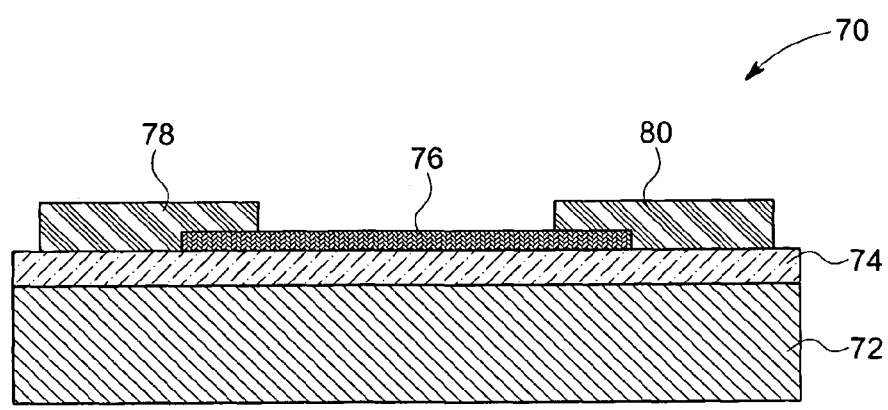
FIG. 6 is a cross-sectional view of a nanowire field effect transistor in accordance with embodiments of the present invention.

FIG. 6 is a cross-sectional view of an exemplary FET 70 in accordance with another embodiment of the invention. In a particular embodiment, the FET 70 may be an element of a large array of a nanoelectronic device. The FET 70 includes a gate metal 72 as a substrate. Some non-limiting examples of the gate metal 72 may include degenerately doped silicon. A gate dielectric 74 may be deposited onto the gate metal 72. Some non-limiting examples of the gate dielectric 74 may include silicon oxide, silicon nitride, aluminum oxide, zirconium oxide and hafnium oxide. Multiple nanowires 76 may further be deposited onto the gate dielectric 74 via the modified LB technique as described with reference to FIG. 1. A photoresist (not shown) is deposited and patterned on top of the nanowires 76 in order to make space for a source electrode 78 and a drain electrode 80. In a particular embodiment, the photoresist is patterned via photolithography. The source electrode 78 and the drain electrode 80 are then deposited onto the nanowires 76, as illustrated in FIG. 6. Some non-limiting examples of the source electrode 78 and the drain electrode 80 may include titanium, gold, nickel and palladium.

Figure 7:
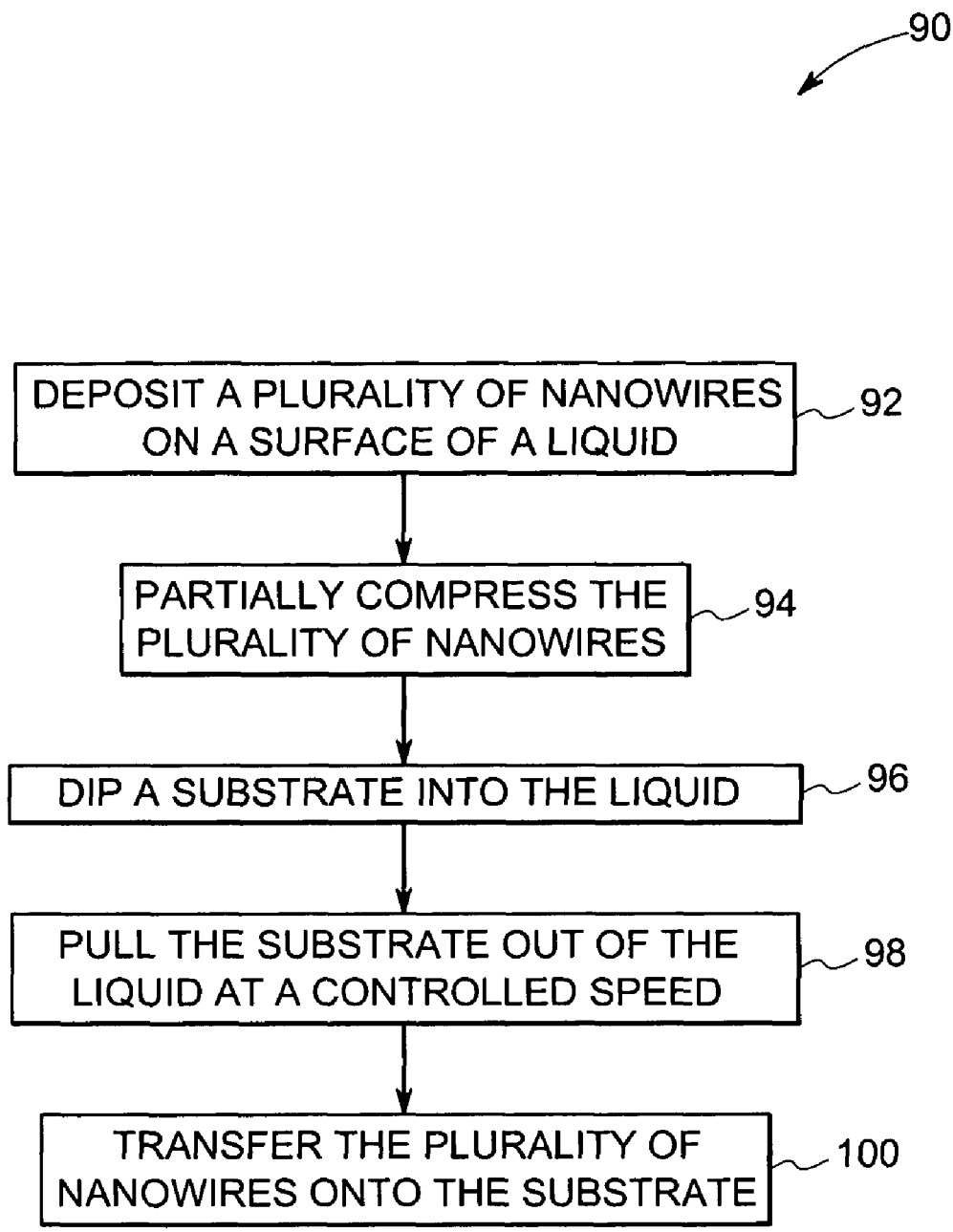
FIG. 7 is a flow chart illustrating exemplary steps in a method of depositing nanowires on a substrate in accordance with embodiments of the present invention.

FIG. 7 is a flow chart illustrating exemplary steps in a method 90 for depositing nanowires. The method 90 may include depositing a plurality of nanowires onto a surface of a liquid in step 92. The nanowires are partially compressed in step 94. In a particular embodiment, the nanowires are partially compressed by depositing multiple spacer molecules between the nanowires. A substrate is dipped into the liquid in step 96. The substrate is pulled out of the liquid at a controlled speed in step 98. In an exemplary embodiment, the substrate is dipped and pulled via multiple rollers. In another embodiment, the controlled speed includes a range between about 5 mm/min and 300 mm/min. During the process of pulling in step 98, the nanowires are transferred onto the substrate parallel to a direction of the pulling in step 100. In particular, the surface tension forces at the air-liquid interface and the rotational forces that occur as a result of the vertical pull of the substrate through the interface generally facilitate alignment and transfer of the nanowires onto the surface of the substrate in parallel to the direction of the pull.

The method 90 of the present invention provides certain improvements over conventional LB processes. For example, as described above, the process of the present invention involves the use of a partially compressed nanowire film, whereas in conventional LB processes, the film is compressed to substantially full density; that is, in the method of the present invention the nanowire film is compressed to some fraction of its theoretical density. In some embodiments, this fraction may range from about 5 percent to about 90 percent of an area of deposition of the nanowires on the substrate. Moreover, the substrate withdrawal speed is controlled in the method of the present invention as described above. This speed control, coupled with the use of a partially compressed film, results in the deposition of nanowires having an aligned orientation on the substrate, and the nanowire deposition may be done with improved control over the density of nanowire deposition compared with conventional processes. For example, the nanowires may be deposited at a comparatively lower density than those typically achieved in conventional processes, which allows for deposition at precise locations for various passive and active electronic device applications. Furthermore, the alignment of the nanowires on the substrate may range within about +/−20 degrees enabling a yield of well-ordered arrays of nanoelectronic devices based on such nanowires. Thus, the method of the present invention enables manufacturing of passive devices such as, but not limited to, display films and polarizers in addition to manufacturing functional electronics, sensor and optical nanodevice arrays.

Various techniques may be employed in conjunction with the process, in order to aid in the transfer of nanowires onto the surface of the substrate. For example, in one particular embodiment, standing waves may be generated in the liquid in order to trap the nanowires against the surface of the substrate during the pull (step 98). The standing waves may be generated using ultrasonic agitation, for example. In another embodiment, multiple magnetic electrodes may be applied on the substrate and magnetic tips may be applied on the nanowires to create preferential attraction of the nanowires to the electrodes to enhance deposition and placement of the nanowires on the surface of the substrate. Further, in another embodiment, the substrate may be chemically treated in order to control placement of the nanowires in pre-defined locations of the substrate. For instance, a hydrophobic material may be used to treat areas of the substrate on which nanowires are not desired. Hydrophobic materials, such as hexamethyldisilazane (HMDS), trimethlysilyl (TMS) or pentamethylsilyl (PMPS) or any other material that provides a methyl group residue. As will be appreciated, any such area on the substrate treated with such material will be resistant to nanowire adhesion. Alternatively, materials that provide an amino group residue could be used to treat areas where nanowire transfer is desirable, since the nanowires would be attracted to such materials. The use of such process enhancements may result in the nanowires disposed on the substrate in precise locations, allowing for more efficient device fabrication compared to the standard LB nanowire transfer process demonstrated in the art.

Figure 8:
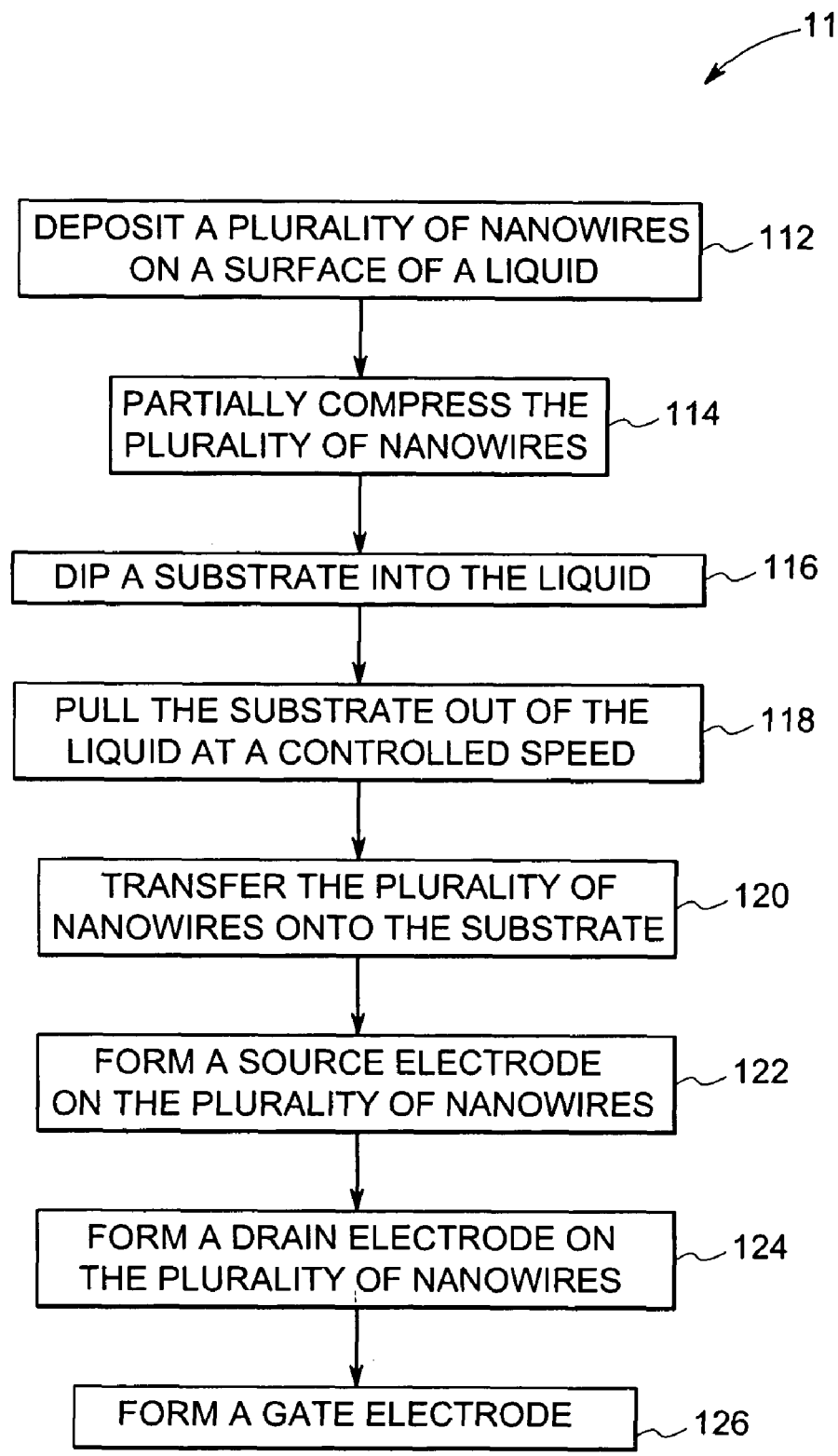
FIG. 8 is a flow chart illustrating exemplary steps in a method of fabricating a nano field effect transistor on a substrate in accordance with embodiments of the present invention.

FIG. 8 is a flow chart illustrating exemplary steps in a method 110 for fabricating a nanoelectronic device array. The method 110 includes depositing multiple nanowires onto a surface of a liquid in step 112. The multiple nanowires may be partially compressed in step 114. A substrate may be dipped into the liquid in step 116. As described above, the substrate may be chemically treated and patterned to aide in the transfer of the nanowires to the desirable locations on the substrate. The substrate may be further pulled out of the liquid at a controlled speed in step 118. In an exemplary embodiment, the substrate is dipped and pulled via multiple rollers. The nanowires may be transferred onto the substrate being pulled parallel to a direction of the pulling in step 120. In a particular embodiment, standing waves may be generated in the liquid in order to trap the nanowires. In another embodiment, the nanowires may be transferred onto the substrate by surface tension of the liquid. A source electrode may be formed on the nanowires in step 122. A drain electrode may also be formed on the nanowires in step 124. In a preferred embodiment, the source electrode and the drain electrode may be formed in a single step. A gate electrode may be further formed in step 126. In a particular embodiment, a photoresist is patterned via a process such as, but not limited to, photolithography on top of the nanowires prior to depositing the source electrode and the drain electrode. In another embodiment, a gate dielectric may be deposited on the gate electrode. In yet another embodiment, the gate dielectric may be deposited on the nanowires. In a particular embodiment, the method 110 may include fabricating a nano field effect transistor array, a nano p-n junction device array, a nanoelectronic logic circuit array, a nanoscale chemical, physical, or biological sensor array, a nanoelectromechanical device array, or a photodetector array.

EXAMPLES

The examples that follow are merely illustrative, and should not be construed to be any sort of limitation on the scope of the claimed invention.

Figure 9:
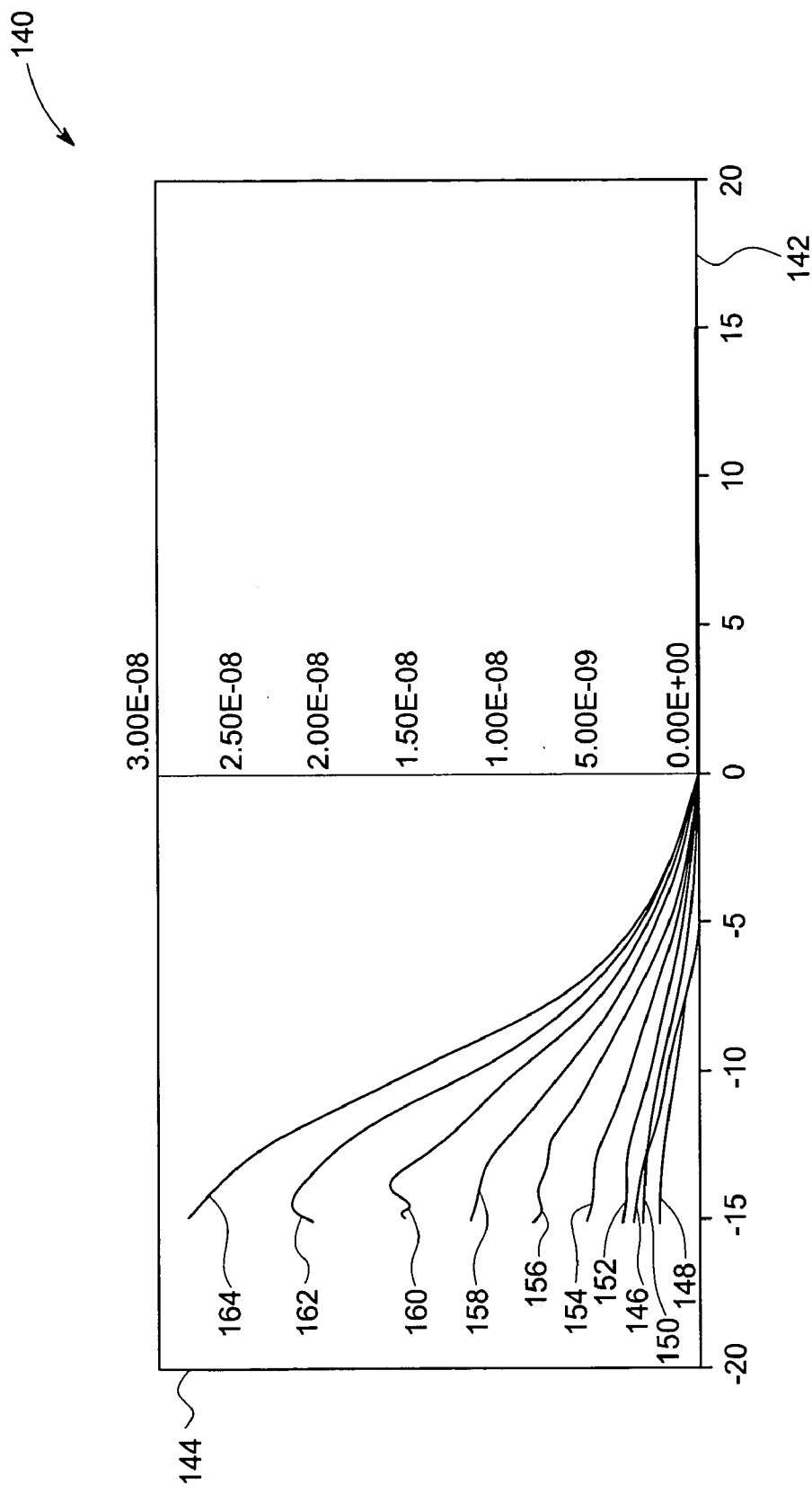
FIG. 9 is a graphical representation of a transfer characteristic curve of the nanowire field effect transistor in FIG. 5 and FIG. 6, illustrating variation of drain-source current as a function of gate voltage at different drain voltages.

FIG. 9 is a graphical representation of a transfer characteristic curve 140 of a nanowire FET fabricated as in FIG. 5 and FIG. 6. Electrodes of the nanowire FET were fabricated by standard photolithography and lift-off process. The nanowires were grown using a low-pressure chemical vapor deposition (LPCVD) system by flowing silane, hydrogen, hydrochloric acid, and trimethylboron. The X-axis 142 represents gate voltage in volts. The Y-axis 144 represents drain current in amperes. Curve 146 represents variation of drain current as a function of gate voltage at a constant drain voltage of 0.1V. Similarly, curves 148, 150, 152, 154, 156, 158, 160, 162 and 164 represent variation of drain current as a function of gate voltage at drain voltages of 0.3V, 0.5V, 0.7V, 0.9V, 1.1V, 1.3V, 1.5V, 1.7V, and 1.9V respectively. Thus, it can be seen from the curves that a functional nanowire FET may be fabricated using the modified LB technique as discussed above.

Figure 10:
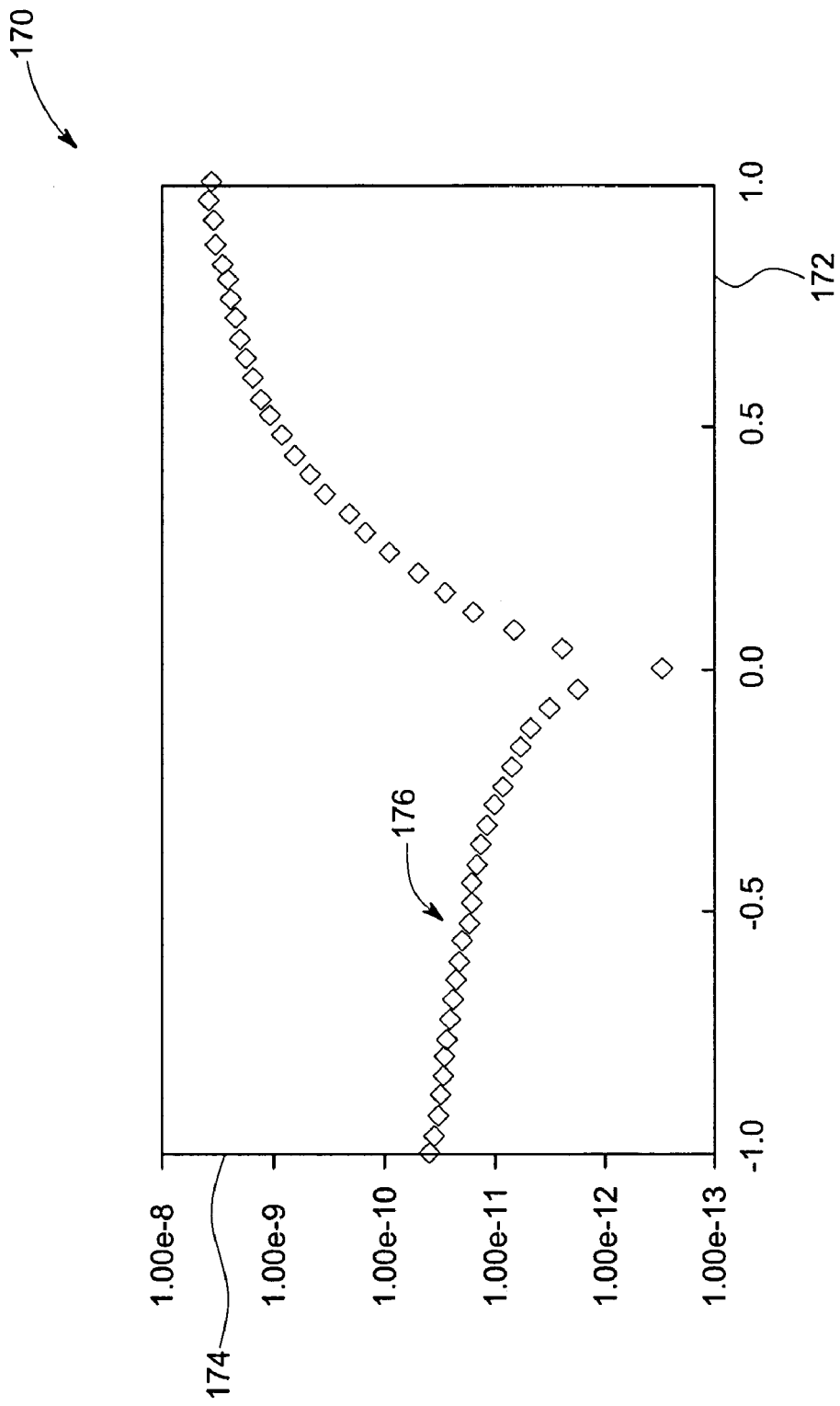
FIG. 10 is a graphical representation of current in a nanowire p-n junction device as a function of voltage.

FIG. 10 is a graphical representation of a current-voltage relationship curve 170 in a nanowire p-n junction device fabricated in accordance with an embodiment of the invention. Nanowires were grown using a LPCVD system by flowing silane, hydrogen, hydrochloric acid, and trimethylboron for a p-type segment followed by flowing phosphine in place of trimethylboron for an n-type segment of the nanowire p-n junction device. The p-n junction device included multiple longitudinal p-n junctions. X-axis 172 represents voltage in volts. Y-axis 174 represents current in amperes. Curve 176 shows variation of the current as a function of the voltage and matches a conventional current-voltage curve that is seen in a functional p-n device. Thus, the curve 176 demonstrates a functional p-n device that has been fabricated using the modified LB technique as discussed above.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for depositing nanowires comprising:
    depositing a plurality of nanowires onto a surface of a liquid;
    partially compressing the plurality of nanowires;
    dipping a substrate into the liquid;
    pulling the substrate out of the liquid at a controlled speed; and
    transferring the plurality of nanowires onto the substrate parallel to a direction of the pulling.

2. The method of claim 1, wherein partially compressing comprises depositing a plurality of spacer molecules between the nanowires.

3. The method of claim 1, wherein dipping a substrate comprises dipping via a plurality of rollers.

4. The method of claim 1, wherein pulling the substrate out comprises pulling out via a plurality of rollers.

5. The method of claim 1, wherein the controlled speed comprises a range between about 5 mm/min and 300 mm/min.

6. The method of claim 1, further comprising applying a plurality of magnetic electrodes on the substrate and applying magnetic tips on the plurality of nanowires.

7. The method of claim 1, further comprising chemically treating the substrate in order to control placement of the plurality of nanowires in pre-defined locations.

8. The method of claim 1, wherein transferring further comprises generating standing waves in the liquid in order to trap the plurality of nanowires.

9. The method of claim 1, wherein the liquid comprises deionized water.

* * * * *